(12) United States Patent
Mallick et al.

(10) Patent No.: US 7,541,297 B2
(45) Date of Patent: Jun. 2, 2009

(54) METHOD AND SYSTEM FOR IMPROVING DIELECTRIC FILM QUALITY FOR VOID FREE GAP FILL

(75) Inventors: Abhijit Basu Mallick, Palo Alto, CA (US); Jeffrey C. Munro, Houston, TX (US); Linlin Wang, San Jose, CA (US); Srinivas D. Nemani, Sunnyvale, CA (US); Yi Zheng, San Jose, CA (US); Zheng Yuan, Fremont, CA (US); Dimitry Lubomirsky, Cupertino, CA (US); Ellie Y. Yieh, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/876,541

(22) Filed: Oct. 22, 2007

(65) Prior Publication Data
US 2009/0104789 A1    Apr. 23, 2009

(51) Int. Cl.
*H01L 21/469*    (2006.01)
*H01L 21/31*    (2006.01)

(52) U.S. Cl. .................. 438/778; 438/758; 438/770; 438/773; 438/787; 257/E21.279; 257/E21.576

(58) Field of Classification Search .......... 257/E21.279, 257/E21.576
See application file for complete search history.

(56) References Cited

U.S. PATENT DOCUMENTS 4,147,571 A    4/1979    Stringfellow et al.
(Continued)

FOREIGN PATENT DOCUMENTS

DE    19654737 A1    7/1997
(Continued)

OTHER PUBLICATIONS

Coltrin, M.E., et al., "Chemistry of AlGaN Particulate Formation," National Nuclear Security Administration, Physical, Chemical, & Nano Sciences Center, Research Briefs, 2005, pp. 42-43.

(Continued)

*Primary Examiner*—Walter L Lindsay, Jr.
*Assistant Examiner*—Mohsen Ahmadi
(74) *Attorney, Agent, or Firm*—Townsend and Townsend and Crew (57) ABSTRACT

A method of forming a silicon oxide layer on a substrate. The method includes providing a substrate and forming a first silicon oxide layer overlying at least a portion of the substrate, the first silicon oxide layer including residual water, hydroxyl groups, and carbon species. The method further includes exposing the first silicon oxide layer to a plurality of silicon-containing species to form a plurality of amorphous silicon components being partially intermixed with the first silicon oxide layer. Additionally, the method includes annealing the first silicon oxide layer partially intermixed with the plurality of amorphous silicon components in an oxidative environment to form a second silicon oxide layer on the substrate. At least a portion of amorphous silicon components are oxidized to become part of the second silicon oxide layer and unreacted residual hydroxyl groups and carbon species in the second silicon oxide layer are substantially removed.

7 Claims, 8 Drawing Sheets

U.S. PATENT DOCUMENTS

| | | | |
|---|---|---|---|
| 5,016,332 | A | 5/1991 | Reichelderfer et al. |
| 5,110,407 | A | 5/1992 | Ono et al. |
| 5,426,076 | A | 6/1995 | Moghadam |
| 5,558,717 | A | 9/1996 | Zhao et al. |
| 5,587,014 | A | 12/1996 | Leychika et al. |
| 5,635,409 | A | 6/1997 | Moslehi |
| 5,937,308 | A | 8/1999 | Gardner et al. |
| 6,009,830 | A | 1/2000 | Li et al. |
| 6,024,044 | A | 2/2000 | Law et al. |
| 6,090,723 | A | 7/2000 | Thakur et al. |
| 6,156,581 | A | 12/2000 | Vaudo et al. |
| 6,302,964 | B1 | 10/2001 | Umotoy et al. |
| 6,383,954 | B1 | 5/2002 | Wang et al. |
| 6,387,207 | B1 | 5/2002 | Janakiraman et al. |
| 6,406,677 | B1 | 6/2002 | Carter et al. |
| 6,508,879 | B1 | 1/2003 | Hashimoto |
| 6,509,283 | B1 | 1/2003 | Thomas |
| 6,528,332 | B2 | 3/2003 | Mahanpour et al. |
| 6,548,416 | B2 | 4/2003 | Han et al. |
| 6,614,181 | B1 | 9/2003 | Harvey et al. |
| 6,660,391 | B1 | 12/2003 | Rose et al. |
| 6,676,751 | B2 | 1/2004 | Solomon et al. |
| 6,756,085 | B2 | 6/2004 | Waldfried et al. |
| 6,794,290 | B1 | 9/2004 | Papasouliotis et al. |
| 6,830,624 | B2 | 12/2004 | Janakiraman et al. |
| 6,833,052 | B2 | 12/2004 | Li et al. |
| 6,867,086 | B1 | 3/2005 | Chen et al. |
| 6,890,403 | B2 | 5/2005 | Cheung |
| 6,900,067 | B2 | 5/2005 | Kobayashi et al. |
| 6,958,112 | B2 | 10/2005 | Karim et al. |
| 7,018,902 | B2 | 3/2006 | Visokay et al. |
| 7,084,076 | B2 | 8/2006 | Park et al. |
| 7,148,155 | B1 | 12/2006 | Tarafdar et al. |
| 7,205,248 | B2 | 4/2007 | Li et al. |
| 7,220,461 | B2 * | 5/2007 | Hasebe et al. ............... 427/533 |
| 2001/0021595 | A1 | 9/2001 | Jang et al. |
| 2001/0054387 | A1 | 12/2001 | Frankel et al. |
| 2002/0127350 | A1 | 9/2002 | Ishikawa et al. |
| 2003/0064154 | A1 | 4/2003 | Laxman et al. |
| 2003/0143841 | A1 | 7/2003 | Yang et al. |
| 2003/0159656 | A1 | 8/2003 | Tan et al. |
| 2003/0172872 | A1 | 9/2003 | Thakur et al. |
| 2004/0048492 | A1 | 3/2004 | Ishikawa et al. |
| 2004/0065253 | A1 | 4/2004 | Pois et al. |
| 2004/0079118 | A1 | 4/2004 | M'Saad et al. |
| 2004/0146661 | A1 | 7/2004 | Kapoor et al. |
| 2004/0152342 | A1 | 8/2004 | Li et al. |
| 2004/0161899 | A1 | 8/2004 | Luo et al. |
| 2004/0175501 | A1 | 9/2004 | Lukas et al. |
| 2004/0180557 | A1 | 9/2004 | Park et al. |
| 2004/0185641 | A1 | 9/2004 | Tanabe et al. |
| 2004/0241342 | A1 | 12/2004 | Karim et al. |
| 2005/0001556 | A1 | 1/2005 | Hoffman et al. |
| 2005/0196533 | A1 * | 9/2005 | Hasebe et al. ............ 427/248.1 |
| 2005/0250340 | A1 | 11/2005 | Chen et al. |
| 2006/0011984 | A1 | 1/2006 | Curie |
| 2006/0030165 | A1 | 2/2006 | Ingle et al. |
| 2006/0121394 | A1 | 6/2006 | Chi |
| 2007/0026689 | A1 | 2/2007 | Nakata et al. |
| 2007/0128864 | A1 | 6/2007 | Ma et al. |
| 2007/0281496 | A1 | 12/2007 | Ingle et al. |

FOREIGN PATENT DOCUMENTS

| | | | |
|---|---|---|---|
| EP | 1717848 A | 11/2006 | |
| WO | WO 03/066933 A | 8/2003 | |
| WO | WO 2005/078784 A | 8/2005 | |
| WO | WO 2007/140376 A | 12/2007 | |
| WO | WO 2007/140424 A | 12/2007 | |

OTHER PUBLICATIONS

Kang, Hun, "A Study of the Nucleation and Formation of Multifunctional Nanostructures using GaN-Based Materials for Device Applications," Georgia Institute of Technology, Doctor of Philosophy in the School of Electrical & Computer Engineering Dissertation, Dec. 2006, p. 14.

Gulleri, G. et al., "Deposition Temperature Determination of HDPCVD Silicon Dioxide Films," 2005, Microelectronic Engineering, vol. 82, pp. 236-241.

PCT International Search Report and Written Opinion mailed on Jul. 30, 2008 by the European Patent Office, International Application No. PCT/US2007/081139, 19 pages.

* cited by examiner

METHOD AND SYSTEM FOR IMPROVING DIELECTRIC FILM QUALITY FOR VOID FREE GAP FILL

CROSS-REFERENCES TO RELATED APPLICATIONS

This application is related to co-assigned U.S. Patent Application No. 60/803,493 by Ingle et al, and titled "CHEMICAL VAPOR DEPOSITION OF HIGH QUALITY FLOW-LIKE SILICON DIOXIDE USING A SILICON CONTAINING PRECURSOR AND ATOMIC OXYGEN", filed on May 30, 2006. This application is also related to co-assigned U.S. Non-provisional patent application Ser. No. 11/845,445 by Mallick et al, and titled "CURING METHODS FOR SILICON DIOXIDE THIN FILMS DEPOSITED FROM ALKOXYSILANE PRECURSOR WITH HARP II PROCESS", also filed Aug. 27, 2007. This application is additionally related to co-assigned U.S. patent application Ser. No. 11/876,538, by Mallick et al, and titled "HIGH QUALITY SILICON OXIDE FILMS BY REMOTE PLASMA CVD FROM DISILANE PRECURSORS", also filed Oct. 22, 2007 The entire contents of all the above applications is hereby incorporated by reference for all purposes.

FIELD OF THE INVENTION

The present invention is directed to semiconductor thin film process techniques. Methods and system are described for improving quality of the dielectric film morphologically adapted over various device structures. More particularly, embodiments of the invention provide methods and system of forming silicon oxide film with increased density to achieve void free gap fill for trenches with high aspect ratio. For example, the invention is applied to form high quality silicon oxide films for filling narrow STI trenches, among other applications.

BACKGROUND OF THE INVENTION

Gaps and trenches such as shallow trench isolation (STI) structures are commonly employed to electrically isolate elements on semiconductor devices. An STI may include a trench or gap formed in an isolation region of a semiconductor substrate that is filled with a dielectric material to hinder the electrical coupling of nearby device structures (e.g., transistors, diodes, etc.). As the device density on integrated circuits continues to increase, the size and distance between device structures is decreasing. However, the vertical heights of the STI trenches normally do not decrease as fast as their horizontal widths, resulting in gaps and trenches with larger ratios of height to width (i.e., higher the aspect ratios).

While the ability to make device structures with increasing aspect ratios allows more of the structures (e.g., transistors, capacitors, diodes, etc.) to be packed onto the same surface area of a semiconductor chip substrate, it has also created fabrication problems. One of these problems is the difficulty of completely filling the gaps and trenches in these structures without creating a void or seam during the filling process. Filling gaps and trenches with dielectric materials like silicon oxide is necessary to electrically isolate nearby device structures from each other to minimize electrical noise and current leakage. As aspect ratios increase, it becomes more difficult to fill deep narrow trenches without creating a void or seam in the dielectric material that fills the trench.

Voids and seams in a dielectric layer cause problems both during semiconductor device fabrication and in the finished devices. The voids and seams are formed randomly in the dielectric material and have unpredictable sizes, shapes, locations and densities. This results in unpredictable and inconsistent post-deposition processing of the layer, such as non-uniform etching, polishing, annealing, etc. The voids and seams in the finished devices also create variations in the dielectric qualities of gaps and trenches in device structures. This can result in erratic and inferior device performance due to electrical crosstalk, charge leakage, and in some instances, shorting within the device, among other problems.

Techniques have been developed to minimize the formation of voids and seams during deposition of dielectric materials on high aspect ratio structures. These include slowing the deposition rate of the dielectric material so it stays more conformal to the sidewalls and bottom of the trench. A more conformal deposition can reduce material buildup at the top of the trench and the chance of dielectric material prematurely sealing off the top of the trench to form a void (a problem sometimes referred to as "breadloafing"). Unfortunately however, slowing the deposition rate also means increasing the deposition time, which reduces processing efficiency and production rates.

Another technique to control void formation is to increase the flowability of the deposited dielectric material. A material with more flowability can more quickly fill a void or seam and prevent it from becoming a permanent defect in the fill volume. For example, highly flowable spin-on-glass (SOG) precursors like PSZ (Polysilazene), HSQ (Hydrosilsesequioxane) films, etc., were conventionally employed for filling trenches with good gap-filling capabilities. However, increasing the flowability of an silicon oxide dielectric material by such conventional SOG films often results in an as-deposited film with low film density caused by residual carbon species and unreacted silanol groups. One approach to increased film densification is to use high-temperature annealing when curing the SOG film into a silicon oxide film. However, the high-temperature annealing used to remove residual carbon species and OH groups may also cause a considerable degree of volumetric shrinkage of film. In narrow trenches for STI applications, the as-deposited films are constrained and unable to shrink, resulting low density films with porous or void containing structures.

Thus, there remains a need of techniques for improving the quality of dielectrics such as silicon oxide films for achieving void free gap fill in narrow trench STI applications during modern semiconductor processing. These and other aspects of dielectric film depositions and chemical treatments are addressed by the present invention.

BRIEF SUMMARY OF THE INVENTION

The present invention is directed to semiconductor thin film process techniques. Methods and system are described for improving quality of the dielectric film morphologically adapted over various device structures. More particularly, embodiments of the invention provide methods and systems of forming silicon oxide film with increased density to achieve void free gap fill for trenches having a high aspect ratio. For example, the invention is applied to form high quality silicon oxide films for filling narrow STI trenches, among other applications.

Embodiments of the present invention include methods of forming a silicon oxide layer on a substrate. These methods may include providing a substrate and forming a first silicon oxide layer overlying at least a portion of the substrate. The first silicon oxide layer includes residual water, hydroxyl groups, and carbon species. Additionally, the methods may include exposing the first silicon oxide layer to a plurality of silicon-containing species during which at least a portion of the plurality of silicon-containing species either react with at least a portion of the residual water and hydroxyl groups, or are thermally decomposed to form a plurality of amorphous silicon components. The plurality of amorphous silicon components may be partially intermixed with the first silicon oxide layer. The methods may still further include annealing the first silicon oxide layer partially intermixed with the plurality of amorphous silicon components in an oxidative environment to form a second silicon oxide layer on the substrate. At least a portion of amorphous silicon components are oxidized to become part of the second silicon oxide layer, and unreacted residual hydroxyl groups and carbon species in the second silicon oxide layer are substantially removed.

Embodiments of the invention also provide a method of forming a silicon oxide layer on a substrate. The method includes providing a substrate including one or more trenches in a semiconductor process chamber. The method further includes depositing a first silicon oxide layer including hydroxyl groups and carbon species on the substrate. The first silicon oxide layer at least partially fills the one or more trenches. Additionally, the method includes introducing a plurality of silicon-containing particles in the semiconductor process chamber. The silicon-containing particles may be incorporated into the first silicon oxide layer. The method further includes forming a second silicon oxide layer by annealing the first silicon oxide layer, which includes the plurality of silicon-containing particles, in an oxidative environment. The plurality of silicon-containing particles are oxidized and the hydroxyl groups and carbon species are substantially removed.

Embodiments of the invention additionally provide a method of forming a silicon oxide layer on a substrate. The method includes providing a substrate in a semiconductor process chamber. The substrate may include one or more trenches. The method further includes depositing a first silicon oxide layer including hydroxyl groups and carbon species on the substrate. The first silicon oxide layer at least partially fills the one or more trenches. Additionally, the method includes introducing a plurality of silicon-containing particles in the semiconductor process chamber. The plurality of silicon-containing particles is incorporated into the first silicon oxide layer. In certain embodiments, introducing a plurality of silicon-containing particles is conducted by generating the silicon-containing particles from a silicon-rich precursor in a plasma and depositing the plasma-generated silicon-containing particles on the first silicon oxide layer by turning off the plasma for a predetermined time period. Furthermore, the method may include forming a second silicon oxide layer by annealing the first silicon oxide layer including the plurality of silicon-containing particles in an oxidative environment so that the plurality of silicon-containing particles are oxidized and the hydroxyl groups and carbon species may be substantially removed.

Additional embodiments and features are set forth in part in the description that follows, and in part that will become apparent to those skilled in the art upon examination of the specification or may be learned by the practice of the invention. The features and advantages of the invention may be realized and attained by the instrumentalities, combinations, and methods described in the specification.

DETAILED DESCRIPTION OF THE INVENTION

Methods and systems are described for improving quality of the dielectric film morphologically adapted over various semiconductor device structures. More particularly, embodiments of the invention provide methods and system of forming silicon oxide film with increased density to achieve void free gap fill for trenches with a high aspect ratio. For example, the invention may be applied to form high quality silicon oxide films for filling narrow STI trenches, among other applications.

Flowable silicon dioxide films deposited by chemical vapor deposition techniques from silicon-containing precursors (e.g., organosilicates) and remote plasma generated atomic oxygen have been applied to STI applications. The as-deposited flowable oxide films may initially have relatively low film density due in part to ingredients like residual water and carbon species, as well as significant hydroxyl groups. During the deposition of the flowable oxide film or after certain amount of flowable oxide film is deposited, silicon can be added. Upon high-temperature annealing of the flowable oxide in an oxidizing atmosphere, the residual carbon species and hydroxyl groups can react, resulting in significant film shrinkage and densification. The added silicon can counterbalance this shrinkage by expanding while it oxidizes in the same oxidizing atmosphere. For STI applications where the dielectric films have many structural constraints in narrow trenches, compensating for the shrinkage of flowable oxide films substantially helps the formation of a dense silicon oxide film that achieves void free gap fill.

Figure 1A:
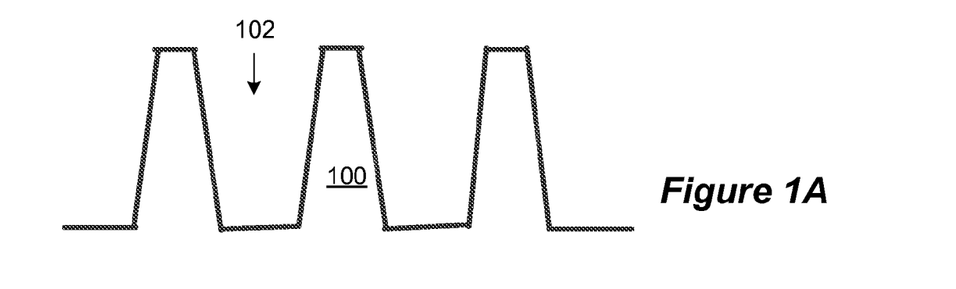
FIGS. 1A-1D are simplified exemplary cross sectional views of processes of forming a silicon oxide layer on a substrate according to an embodiment of the present invention.
Figure 1B:
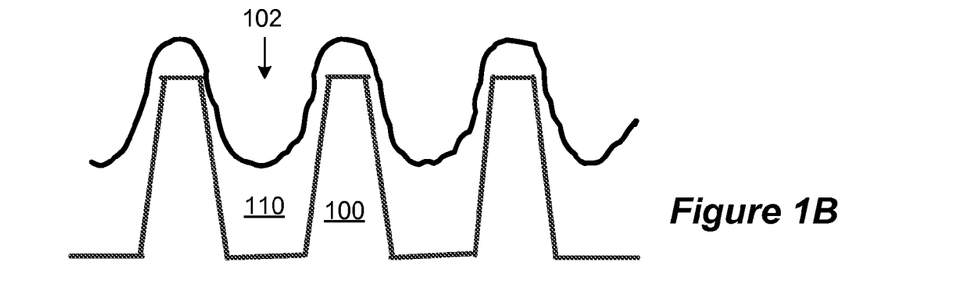
Figure 1C:
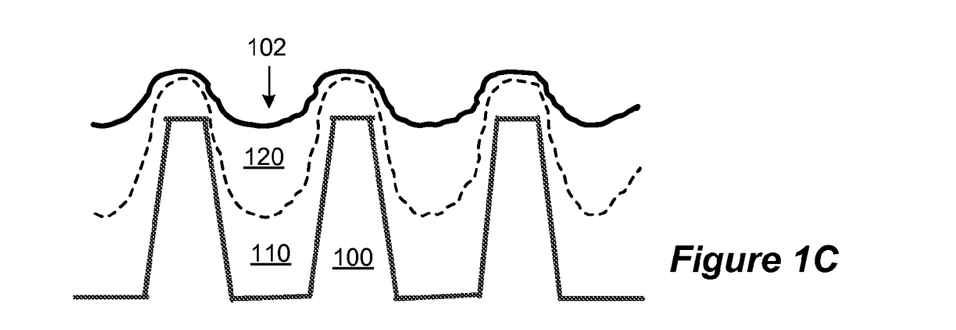
Figure 1D:
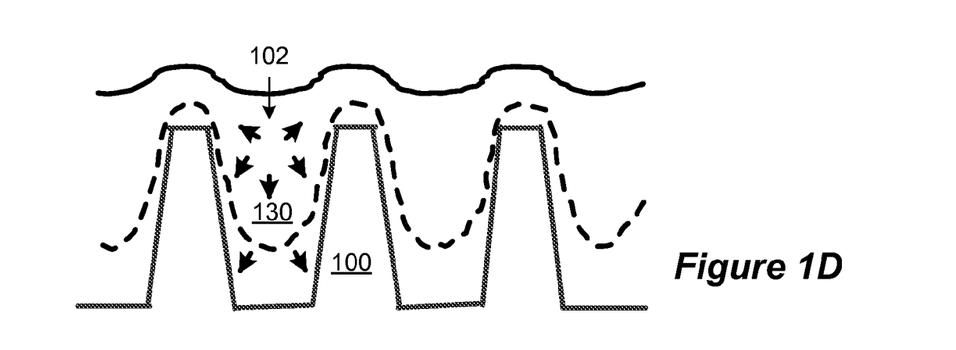
Figure 2:
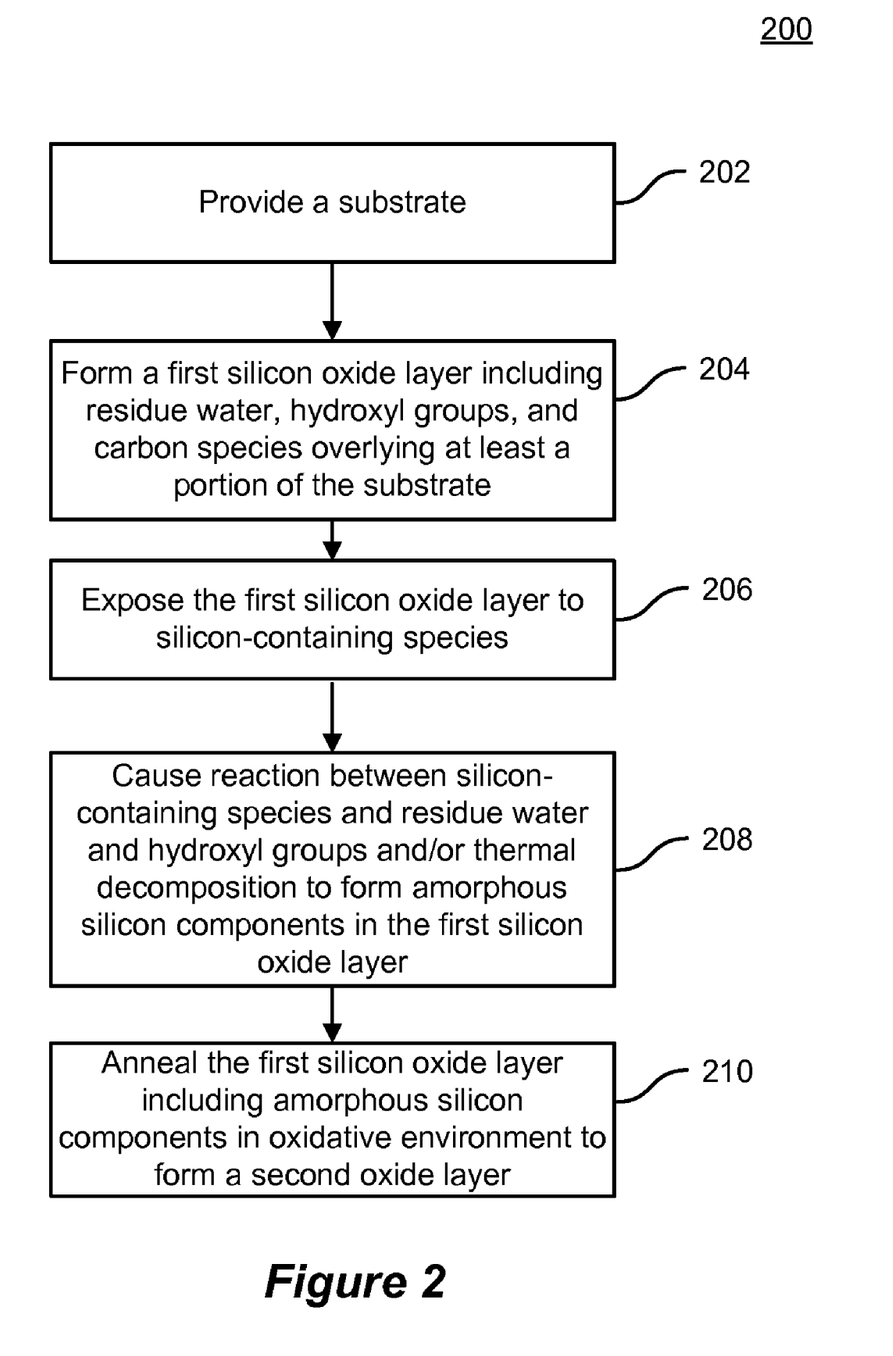
FIG. 2 is a simplified flowchart showing a method of forming a silicon oxide layer on a substrate according to an embodiment of the present invention.

FIGS. 1A-1D are simplified exemplary cross sectional views of processes for forming a silicon oxide layer on a substrate according to embodiments of the present invention. These diagrams are merely examples, and are not intended to restrict the invention to only what is illustrated. One of ordinary skill in the art would recognize other variations, modifications, and alternatives. For example, FIGS. 1A-1D may be viewed in conjunction with FIG. 2 which is showing a method of forming a silicon oxide layer on a substrate according to an embodiment of the present invention. As shown in FIG. 2, method 200 includes providing a substrate in process 202. As an example, the substrate is substrate 100 shown in FIGS. 1A-1D. The substrate 100 may be a semiconductor process wafer (e.g., a 200 mm, 300 mm, 400 mm, etc. silicon wafer) and may include structures, device components, etc., formed in earlier processes. In addition, the substrate may include gaps, trenches, etc., with high height to width aspect ratios (e.g., an aspect ratio of 5:1 or more, 6:1 or more, 7:1 or more, 8:1 or more, 9:1 or more, 10:1 or more, 11:1 or more, 12:1 or more, etc.). For example, substrate 100 includes trench 102 having sidewalls and a bottom.

The method 200 then includes a process of forming a silicon oxide layer overlying the at least a portion of the substrate (Process 204). As shown in FIG. 1B, silicon oxide layer 110 is formed overlying the substrate 100 provided in a semiconductor process chamber (an exemplary chamber can be seen in FIG. 7). For example, the silicon oxide layer 110 may be deposited by CVD-based approach using organosilicate precursors and atomic oxygen precursor generated by a remote plasma source as described in co-assigned U.S. patent application No. 60/803,493 by Ingle et al, and titled "CHEMICAL VAPOR DEPOSITION OF HIGH QUALITY FLOW-LIKE SILICON DIOXIDE USING A SILICON CONTAINING PRECURSOR AND ATOMIC OXYGEN", filed on May 30, 2006. Other conventional methods for depositing silicon oxide films such as spin-on, SACVD, and HDP-CVD may also be used as well. In a specific embodiment, the as-deposited silicon oxide layer possesses a flow-like characteristic due to its ingredients including some residual water and carbon species as well as significant hydroxyl groups. In another specific embodiment, the flow-like silicon oxide film may be used for STI applications. For example, shown in FIG. 1B, the sidewalls and bottom of trench 102 as well as substrate surface outside the trench are substantially covered by the formation of silicon oxide layer 110. In another example, depending on the deposition amount in process 204 the as-deposited silicon oxide layer 110 may extend from filling a partial depth of trench 102 to completely filling and extending over trench 102.

As a result of process 204, silicon oxide layer 110 completely fills at least a portion of trench 102 with no voiding or seams. However, direct use of the as-deposited film by process 204 can result in a dielectric that is too porous and does not have an adequate mechanical strength. Thus, certain embodiments of the present invention are applied to perform further treatment of the as-deposited silicon oxide layer 110 to improve film quality with increased density and still achieve void free gap fill.

In one embodiment, the as-deposited silicon oxide film is exposed to a plurality of silicon-containing species (Process 206). For example, after the deposition of silicon oxide film at process 204, the plurality of silicon-containing species can be introduced into the same semiconductor process chamber. In another example, the exposure of the silicon-containing species may be performed in a separate chamber other than the semiconductor process chamber for depositing silicon oxide layer (at process 204). In one embodiment, the silicon-containing species includes one or a combination of following species: linear polysilanes (silane, disilane, and higher homologues), cyclic polysilanes (cyclopentasilane), dichlorosilane, tetrachlorosilane, and similar species. In another embodiment, each of the silicon-containing species is in gas phase supplied from either a pure gas source or diluted with an inert gas, such as $N_2$ or He. Of course, one skilled in the art would recognize many variations, alternatives, and modifications.

In another embodiment, Process 206 is carried under the following conditions including an exposure temperature varied from about room temperature to about 900° C., an exposure pressure (of the gas-phase silicon-containing species) varied from about 10 mTorr to about 600 Torr, and a exposure time varied from about 1 second to about 3 hours. Depending on many process factors such as the aspect ratio of the STI trenches and specific device applications with desired film thickness and other physical properties, these conditions may vary but should not unduly limit the scope of the claims herein. In a specific embodiment, the exposure of the plurality of silicon-containing species under proper process conditions may cause reactions of the silicon-containing species with the residual water and hydroxyl groups existed in the as-deposited silicon oxide layer or direct thermal decompositions of the silicon-containing species, resulting a formation of an amorphous silicon layer (Process 208). For example, the chemical reactions may include some hydrolysis processes to replace alkoxide group with hydroxyl group and some condensation processes to remove alkoxide group and hydroxyl group as alcohol and water vapors. In another example, the thermal decomposition may occur as precursor molecules of the silicon-containing species land on the surface and some Si—H bonds break to form $H_2$ gas molecules with Si and/or Si—H clusters left behind. Referring to FIG. 1C, this process is illustrated by the resulted formation of an amorphous silicon layer 120 on the silicon oxide layer 110 deposited earlier. In one embodiment, due to the reactions between the silicon-containing species and the ingredients inside the silicon oxide layer, the formed amorphous silicon layer 120 is partially intermixed with the silicon oxide layer 110 (so that there may not be a clear interface, as represented by a dashed line in FIG. 1C, between the amorphous silicon layer and the silicon oxide layer).

Subsequently, the method 200 includes annealing the earlier deposited silicon oxide layer and the later formed amorphous silicon layer on the substrate in an oxidative environment, resulting in a formation of a silicon oxide layer with an increased density (Process 210). In one embodiment, the oxidative environment may be a steam environment with a temperature up to about 900° C., or an ozone environment from room temperature to about 600° C., or a chamber full of molecular oxygen from room temperature to about 900° C., or a chamber containing atomic oxygen at room temperature to about 600° C. In another embodiment, the annealing process is done in a rapid thermal process (RTP) chamber with temperature control. The annealing of the amorphous silicon layer in the oxidative environment directly causes oxidization of the amorphous silicon clusters to form silicon dioxide. The oxidation process causes the film to expand in volume, as schematically indicated by a circle arrows in FIG. 1D. In yet another embodiment, the annealing of the silicon oxide layer causes the unreacted residual carbon species and hydroxyl groups to be removed from the film. For example, the residual carbon species and hydroxyl groups may react to form alcohol/water vapors and continuously be pumped out. The prolonged annealing should remove substantially all residual water, carbon, or hydroxyl groups. In another example, acidic vapor with a certain water-to-acid ratio as a catalyst may be mixed into the oxidative environment to accelerate the removal of unwanted carbon species. Further detail about the treatment of the flowable silicon oxide film using acidic vapor can be found in a co-assigned U.S. Non-provisional patent application Ser. No. 11/845,445 by Mallick et al, and titled "CURING METHODS FOR SILICON DIOXIDE THIN FILMS DEPOSITED FROM ALKOXYSILANE PRECURSOR WITH HARP II PROCESS", filed on Aug. 27, 2007. The loss of the residual carbon species and hydroxyl groups results in a shrinkage of the silicon oxide layer, as schematically indicated by the two arrows near the bottom of the trench 102 in FIG. 1D.

In a specific embodiment, the shrinkage necessarily densify the oxide film and at the same time the expansion of oxidation of amorphous silicon effectively compensates the volume loss, resulting a denser oxide film but still free of voids or seams. Especially in the narrow trenches with high aspect ratio, such inherent volume compensation would be very important for overcome the geometrical constraints to the shrinkage of the film and eliminate the formation of possible voids and seams. As shown in FIG. 1D, after the annealing process a silicon oxide film 130 on the substrate 100 is formed from the partial inter-mixed amorphous silicon layer 120 and the silicon oxide layer 110, which substantially fills all the trench 102 and beyond. In one embodiment, the silicon oxide layer 130 formed using the method 200 can be a non-porous, dense film, and of a higher mechanical strength than the previous deposited silicon oxide layer 110. Thus, a high-quality silicon oxide layer is obtained while still maintaining the flow-like characteristics necessary for high aspect ration gap-fill processes.

Figure 3A:
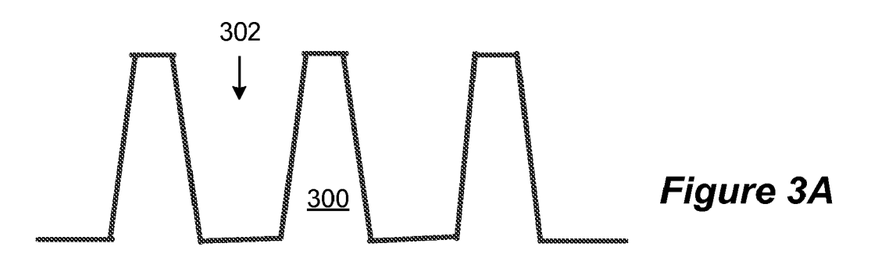
FIGS. 3A-3F are simplified exemplary cross sectional views of processes for alternating gap-fill oxide depositions and treatments according to another embodiment of the present invention.
Figure 3B:
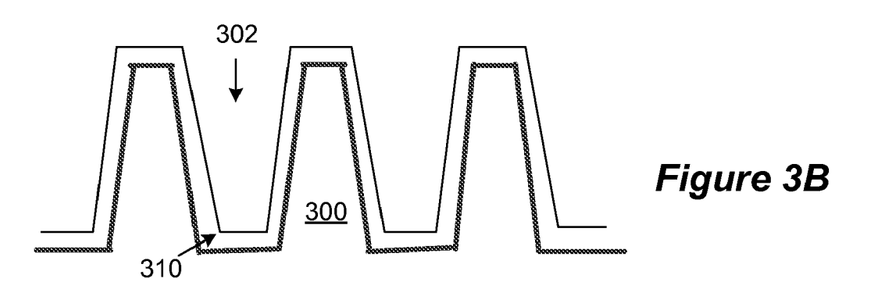
Figure 3C:
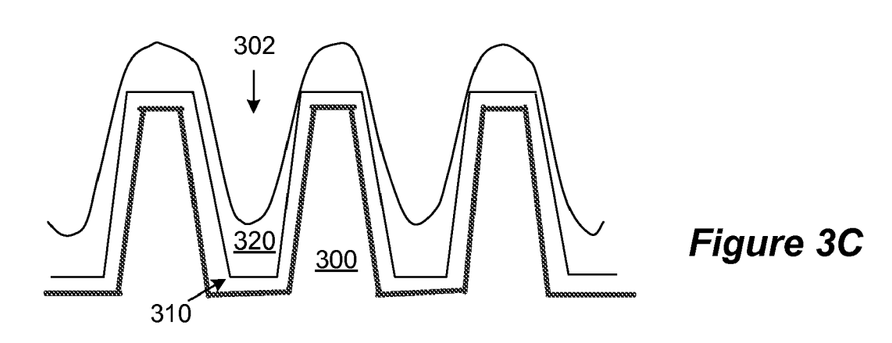
Figure 3D:
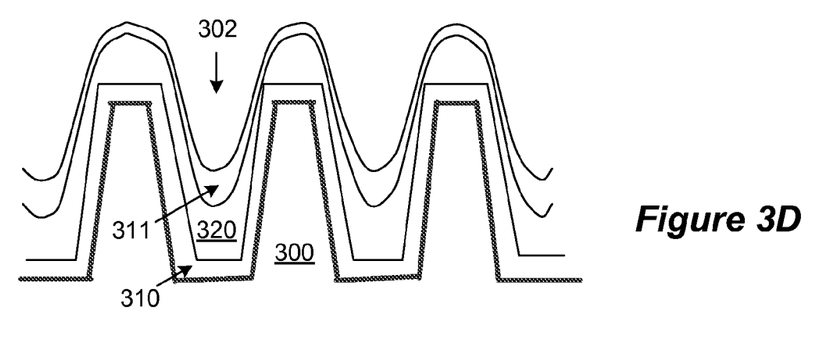
Figure 3E:
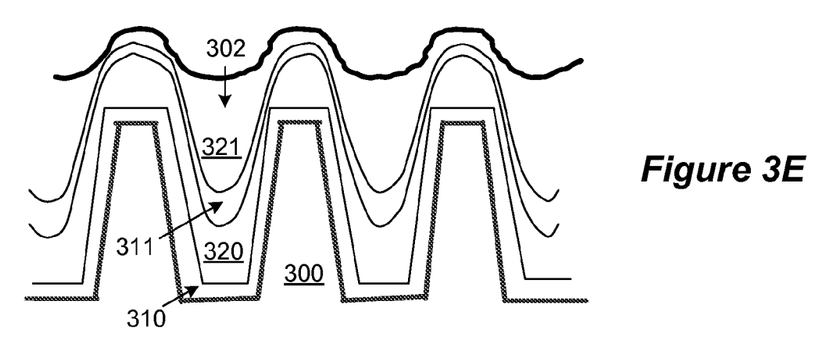
Figure 3F:
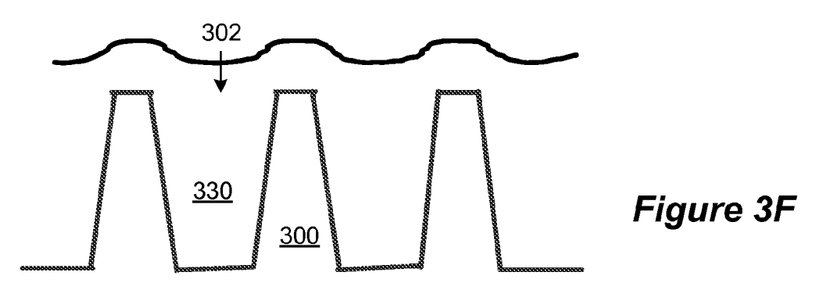
Figure 4:
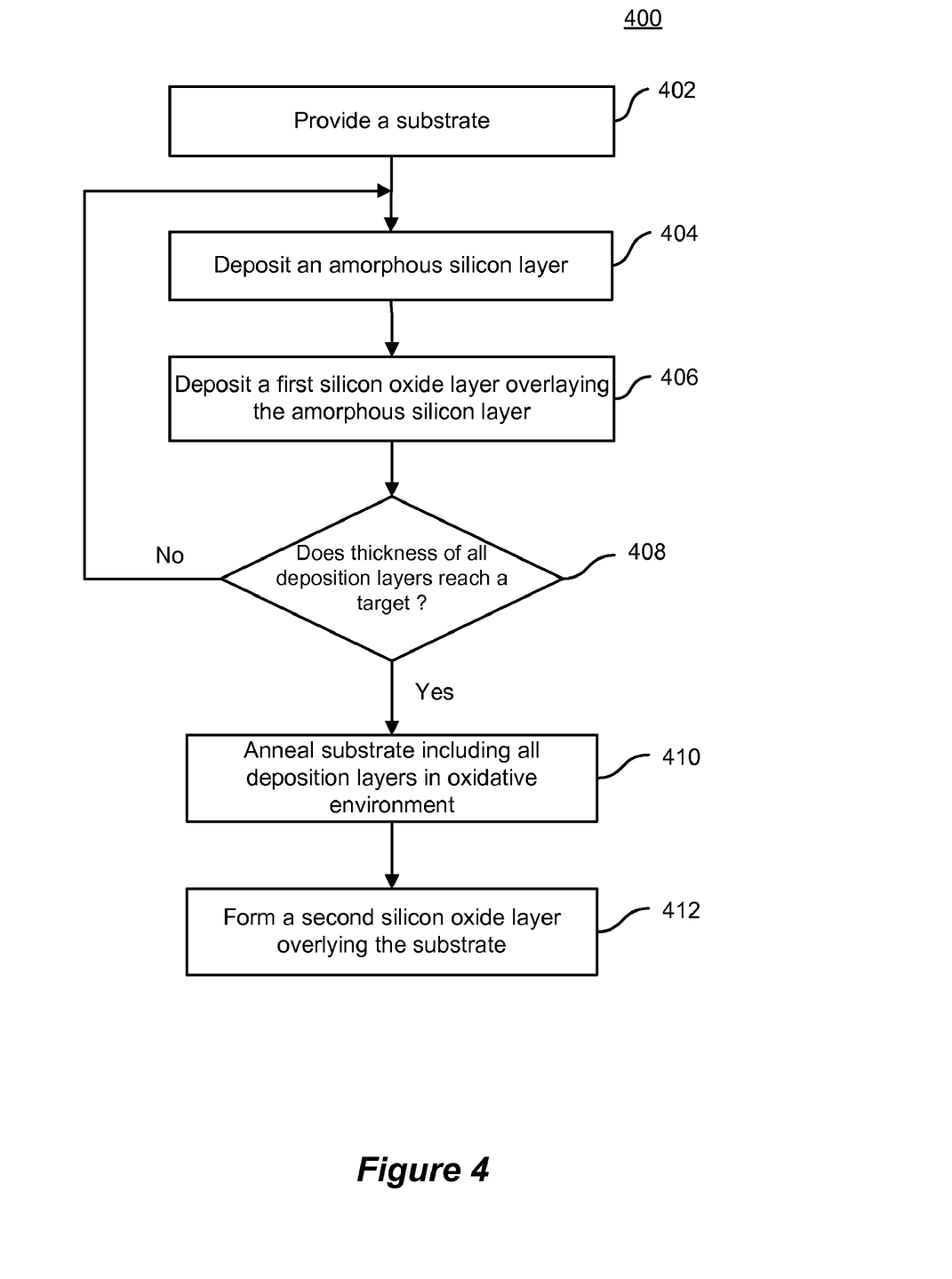
FIG. 4 is a simplified flowchart showing a method of forming a silicon oxide layer on a substrate according to an embodiment of the present invention.

FIGS. 3A-3F are simplified exemplary cross sectional views of processes for alternating gap-fill oxide depositions and treatments according to another embodiment of the present invention. These diagrams are merely examples, which should not unduly limit the scope of the claims herein. One of ordinary skill in the art would recognize other variations, modifications, and alternatives. For example, FIGS. 3A-3F may be viewed in conjunction with FIG. 4 which is showing a method 400 of forming a silicon oxide layer on a substrate according to an embodiment of the present invention. As shown in FIG. 3A, a semiconductor substrate 300 is provided. Referring to FIG. 4, this substrate can be provided at process 402 of the method 400 into a semiconductor process chamber (shown as an example in FIG. 7 below). The substrate 300 may be a semiconductor wafer (e.g., a 200 mm, 300 mm, 400 mm, etc. silicon wafer) and may include structures, device components, etc., formed in earlier processes. In addition, the substrate may include gaps, trenches, etc., with high height to width aspect ratios (e.g., an aspect ratio of 5:1 or more, 6:1 or more, 7:1 or more, 8:1 or more, 9:1 or more, 10:1 or more, 11:1 or more, 12:1 or more, etc.). For example, substrate 300 includes trench 302 having sidewalls and a bottom.

At the process 404, the method 400 includes performing deposition of an amorphous silicon layer on the substrate. The amorphous silicon layer can be deposited using a variety of different techniques under sub-atmospheric environment, including but not limited to: thermal CVD, plasma CVD, plasma jet, or hot wire CVD. The precursors for the silicon deposition may include linear polysilanes (silane, disilane, and higher homologues), cyclic polysilanes (cyclopentasilane), alkyl silanes (methylsilane, trimethylsilane, tetramethylsilane), dichlorosilane, tetrachlorosilane, or some other silicon-containing species. In one specific embodiment, the amorphous silicon layer can be deposited using atomic layer deposition (ALD) technique. The formed thin amorphous silicon layer is mainly conformal to follow the trench morphology. For example, referring to FIG. 3B, a conformal thin layer of amorphous silicon 310 is formed on the substrate 300 both inside and outside the trench 302. Depending on the dimensions and aspect ratios of the trenches in various applications, the thickness of this amorphous silicon layer can be controlled such that the trench is only partially filled. For example, only $1/10$ or less of the total trench volume, or $1/5$ or less of the volume, or $1/3$ or less of the volume is filled. In certain embodiments, the amorphous silicon layer may be formed by non-CVD type of methods, for example, Langmuir Blodgett (LB) techniques. In those cases, the deposition of amorphous silicon may be performed in a different chamber.

Subsequently at process 406, the method 400 includes depositing oxide layer overlying the amorphous silicon layer. The oxide layer deposited at process 406 can be the same type of the flowable oxide layer deposited using CVD-based approach using organosilicate precursors and atomic oxygen precursor generated by a remote plasma source. The oxide layer includes certain amounts of residual water, carbon species and hydroxyl groups, making it a flowable film. For example, referring to FIG. 3C, an oxide layer 320 is formed overlying the amorphous silicon layer 310. Depending on the dimensions and aspect ratios of the trenches that have been partially filled by the amorphous silicon layer deposited in earlier processes, the thickness of the flowable oxide layer can be controlled to at least partially fill the trenches. For example, the thickness of the flowable silicon oxide layer can be 5 to 500 Angstroms depending on different applications. In one example, $3/10$ of the total trench volume. In another example, $2/5$ of the trench volume is filled. In yet another example, $2/3$ of the volume or all trench volume extending to the regions outside the trenches can be filled.

Method 400 includes a step of determining whether a certain target thickness of all deposition layers is reached (Process 408). In one embodiment, if the target thickness is not reached, the method 400 includes repeating the process 404 and 406, i.e., another layer of amorphous silicon is deposited (which is expected again to be conformal with present morphology of the partially filled trenches) followed by another deposition of the flowable oxide layer. For example, as shown in FIG. 3D, amorphous silicon layer 311 is added overlying the oxide layer 320. The amorphous silicon layer 311 can be deposited using the same process used for depositing amorphous silicon layer 310, though some alternative deposition techniques also can be used without affecting the results. Subsequently as shown in FIG. 3E, another flowable oxide layer 321 is added overlying the layer 311. In another embodiment, if the target thickness is determined to be reached, method 400 needs no repeating the process 404 and 406. In other words, depending on the applications, certain embodiments of the present method includes just one cycle of the alternate amorphous silicon layer deposition and flowable oxide layer deposition, and certain embodiments of the method includes multiple cycles of performing the above alternate depositions until a pre-determined target thickness is obtained. Of course, there can be many alternatives, variations, and modifications.

After the deposition processes, the method 400 includes annealing the as-deposited layers on the substrate in an oxidative environment at process 410. In one embodiment, the oxidative environment may include steam from room temperature to about 900° C. In certain embodiment, acidic vapor may be added into the steam. In another embodiment, the oxidative environment may include ozone from room temperature to about 600° C. In yet another embodiment, the oxidative environment may include molecular oxygen from room temperature to about 900° C. In yet still another embodiment, the oxidative environment may include atomic oxygen from a remote plasma source at room temperature to about 600° C. The annealing can be performed in the same semiconductor process chamber for performing deposition or in a separate annealing chamber coupled to the semiconductor process chamber. In one example, the annealing chamber is equipped for rapid thermal processing (RTP). Of course, there can be many alternatives, variations, and modifications.

As a result of the annealing process, a silicon oxide layer different from the flowable oxide layer(s) deposited in earlier processes is formed (Process 412). On the one hand, the deposited amorphous silicon layer(s) will oxidize to form silicon dioxide which expands in volume by incorporating oxygen atoms to replace Si—H or Si—Si bonds by Si—O—Si bonds. On the other hand, the thermal annealing causes the reactions between the residual carbon species and hydroxyl groups, resulting in the formation of water or alcohol vapors that are removed by pumps coupled to the annealing chamber. The substantial loss of the residual carbon species and hydroxyl groups in the oxide layer(s) would cause shrinkage of the oxide layer(s) and densification of the final oxide film. In a specific embodiment, the volume expansion of the amorphous silicon layer during oxidation and the shrinkage of the flowable oxide layer properly compensate each other, resulting in a silicon oxide layer with a higher film density and mechanical strength (than the flowable oxide layer). For example, as shown in FIG. 3F, silicon oxide layer 330 resulting from earlier deposited layers 310, 311, 320, 321, etc. is formed after the annealing process. In one embodiment, the silicon oxide layer 330 substantially fills the trench 302 without forming any voids or seams. With proper determination of a target deposition thickness, the silicon oxide layer 330 may extend from completely filling the depth of trench 302 to extending over trench 302 to cover the whole substrate 300. In another embodiment, the void free gap filling oxide layer formed in process 412 has sufficient good quality characterized by properties like film density, stress distribution, dielectric constant, and refractive index that are acceptable for narrow trench STI applications. Of course, there can be many other alternatives, variations, and modifications in broader applications of above embodiments of the present invention.

Figure 5A:
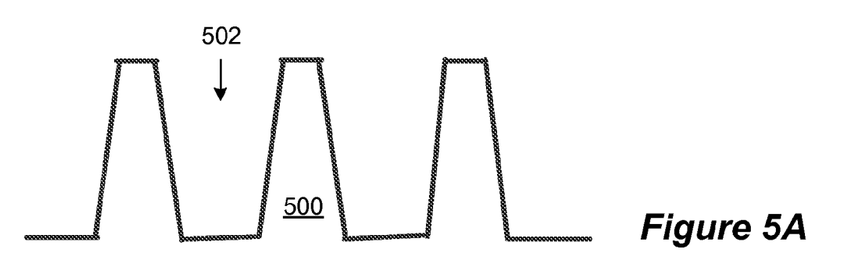
FIGS. 5A-5D are simplified exemplary cross sectional views of processes forming a silicon oxide layer on a substrate according to an alternative embodiment of the present invention.

In an alternative embodiment, high quality of silicon oxide layer for void free gap fill for STI applications can be obtained by incorporating silicon nanoparticles (NP) into the as-deposited flowable oxide film. FIGS. 5A-5D are simplified exemplary cross sectional views of processes forming a silicon oxide layer on a substrate according to an alternative embodiment of the present invention. These diagrams are merely examples, which should not unduly limit the scope of the claims herein. One of ordinary skill in the art would recognize other variations, modifications, and alternatives. For example, FIGS. 5A-5D may be viewed in conjunction with FIG. 6 which is showing a method 600 of forming a silicon oxide layer on a substrate according to an embodiment of the present invention. As shown in FIG. 5A, a semiconductor substrate 500 can be provided in a semiconductor process chamber (an exemplary chamber can be seen in FIG. 7) based on process 602 of method 600. The substrate 500 can include one or more trenches 502 on its surface produced by previous semiconductor processes. For example, the substrate may be a semiconductor wafer (e.g., a 200 mm, 300 mm, 400 mm, etc. silicon wafer) and the one or more trenches may have high aspect ratios (e.g., a depth-to-width ratio of 5:1 or more, 6:1 or more, 7:1 or more, 8:1 or more, 9:1 or more, 10:1 or more, 11:1 or more, 12:1 or more, etc.).

Figure 5B:
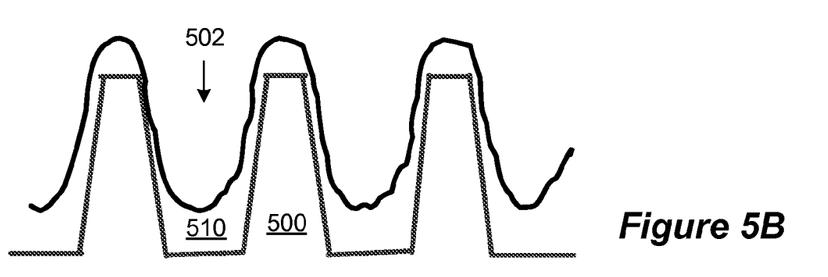
Figure 6:
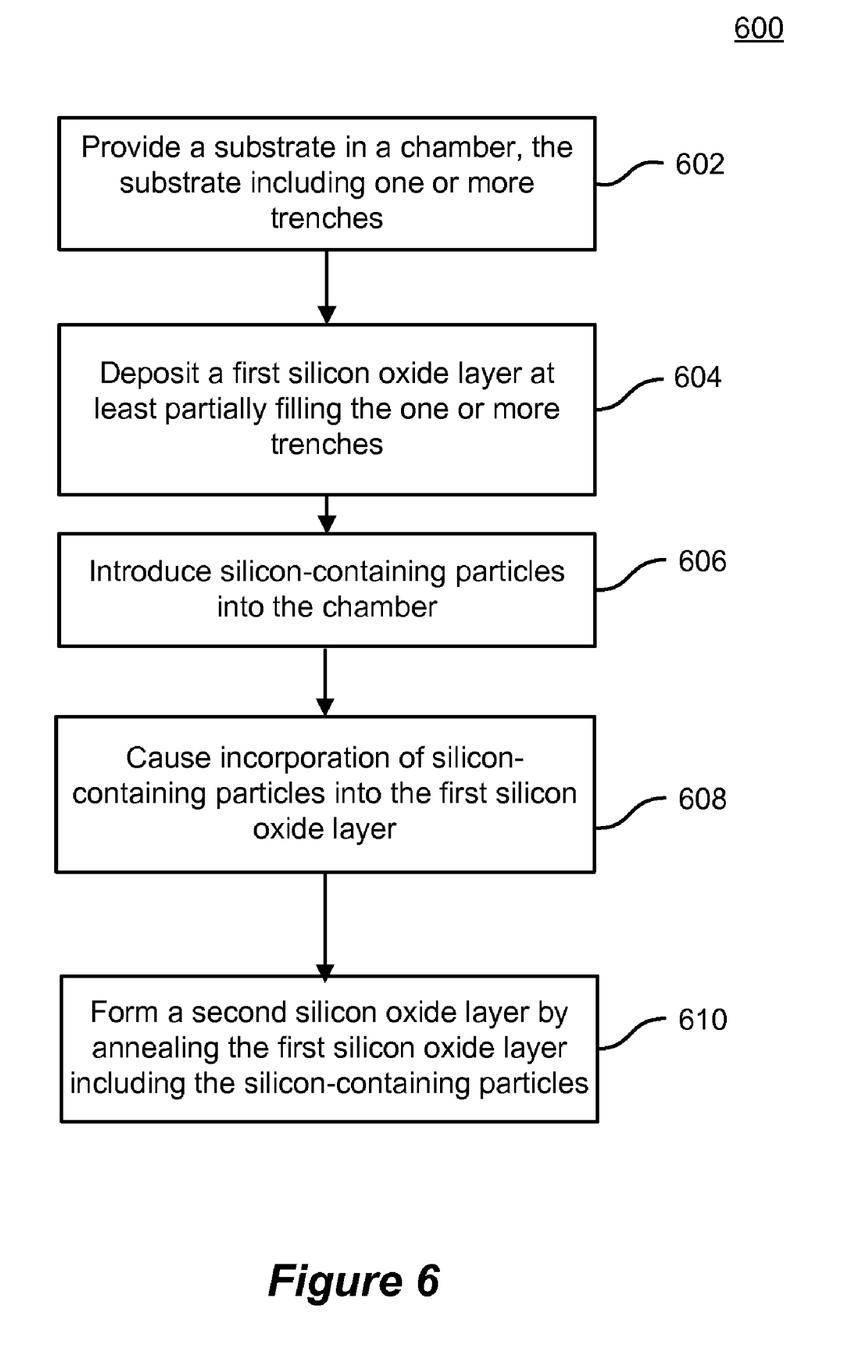
FIG. 6 is a simplified flowchart showing a method of forming a silicon oxide layer on a substrate according to another embodiment of the present invention.

FIG. 5B shows that a flowable oxide layer 510 can be deposited on the substrate 500 using process 604 of method 600. For example, the deposited oxide layer contains some by-product ingredients including carbon species and hydroxyl groups which makes the oxide layer flowable to overlay the substrate with good morphology conformality and at least partially fill the trenches with high aspect ratio even beyond 11:1. In another example, the deposition technique can be a CVD-based approach using liquid organosilicate precursor and oxygen precursor generated by a remote plasma source or other techniques including spin-on, SACVD, and HDP-CVD processes.

At process 606, method 600 includes introducing a plurality of silicon-containing particles into the semiconductor process chamber. In one embodiment, the plurality of silicon-containing particles can be produced using PECVD approach using Si-rich precursors delivered to the semiconductor process chamber either with or separately from the liquid organosilicate precursor for the flowable oxide layer. For example, the Si-rich precursors include linear polysilanes (silane, disilane, and higher homologues), cyclic polysilanes (cyclopentasilane) or silicon nanoparticles. In another example, the plurality of silicon-containing particles can be produced externally and subsequently delivered into the semiconductor process chamber where the substrate 500 is located. In yet another example, the plurality of silicon-containing particles can be directly produced inside the same process chamber for flowable silicon oxide layer deposition (at the process 604).

Figure 5C:
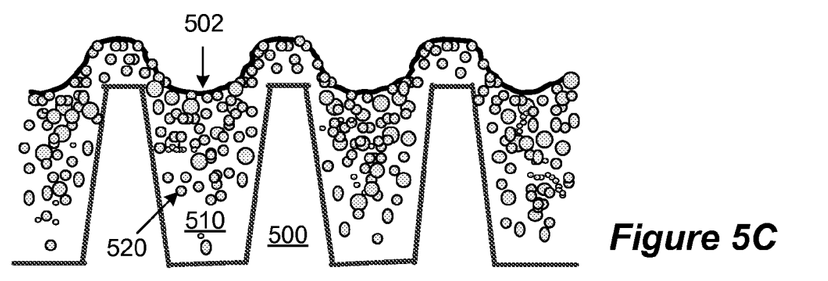

Subsequently, the plurality of silicon-containing particles generated at process 606 are incorporated into the flowable silicon oxide layer deposited at the process 604 on the substrate (Process 608). For example, the silicon-containing particles are generated as a plasma source is turned on at a predetermined process condition and deposition of these particles onto the silicon oxide layer takes place as the plasma source is turned off. Depending at least on the plasma off period, the size of the silicon-containing particles can be controlled. Typically the silicon-containing particles are in spherical shape with a diameter in a range from 10 to 50 nanometers. In one embodiment, the deposition of the silicon-containing particles may take place after a certain thickness of the flowable silicon oxide layer was formed. In another embodiment, the deposition of the silicon-containing particles may take place simultaneously as the flowable silicon oxide layer is being deposited. In this case, process 604 and process 608 (wherein the silicon-containing particles may be generated by a separate or remote plasma source) occurs at the same time. These particles with a narrow size range (from 10 to 50 nanometers) can be easily incorporated into the flowable silicon oxide layer without substantially degrading the flowability of the mixed film for filling the trench. For example, FIG. 5C shows a cross sectional view of a plurality of silicon-containing particles 520 being mixed into the as-deposited flowable silicon oxide layer 510 filling inside and over the trench 502 on the substrate 500. In yet another embodiment, the deposition of flowable silicon oxide layer and silicon-containing particles can be alternatively performed multiple times depending on different applications. Of course, there can be many alternatives, variations, and modifications. For example, the dosage of the silicon-containing particles would be an adjustable process parameter for different applications.

After the deposition/particle-incorporation processes, the process 610 of method 600 includes forming a silicon oxide layer by annealing the as-deposited silicon oxide layer incorporated with a plurality of silicon-containing particles in an oxidative environment. In one embodiment, the oxidative environment may include steam from room temperature to about 900° C. In certain embodiment, acidic vapor may be added into the steam. In another embodiment, the oxidative environment may include ozone from room temperature to about 600° C. In yet another embodiment, the oxidative environment may include molecular oxygen from room temperature to about 900° C. In yet still another embodiment, the oxidative environment may include atomic oxygen from a remote plasma source at room temperature to about 600° C. The annealing can be performed in the same semiconductor process chamber after deposition. The annealing process can also be carried out after the substrate is transferred into a separate annealing chamber from the semiconductor process chamber for deposition. For example, the annealing chamber is a rapid thermal process (RTP) chamber which may be one unit of a cluster tool. Of course, there can be many alternatives, variations, and modifications.

Figure 5D:
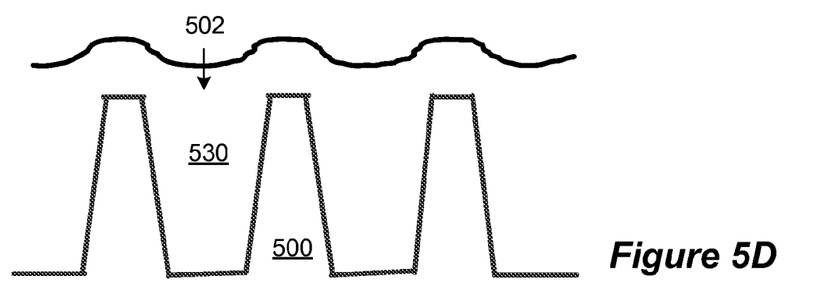

As a result of the annealing process, a silicon oxide layer different from the flowable oxide layer deposited in the earlier process (e.g. process 604) is formed. On the one hand, the annealing process causes the silicon-containing particles to oxidize to form silicon dioxide which expands in volume. On the other hand, the annealing process causes the reactions between the residual carbon species and hydroxyl groups, resulting in the formation of water or alcohol vapors that can be subsequently removed by pumps coupled to the annealing chamber. A substantial loss of those residual carbon species and hydroxyl groups in the silicon oxide layer during a prolonged annealing process can cause a film shrinkage, leading to a higher density of the final oxide film. For example, as shown in FIG. 5D, silicon oxide layer 530 is formed by annealing the flowable silicon oxide layer 510 incorporated with the plurality of silicon-containing particles 520. In a specific embodiment, the amount of the silicon-containing particles is sufficient so that the film volume expansion due to oxidation of the silicon particles can properly compensate the film shrinkage due to the loss of unwanted carbon or hydroxyl species. This results in a silicon oxide layer with much improved quality in terms of strengthened mechanical property. In one embodiment, the finally formed silicon oxide layer 530 may substantially fill the trench 502 without the formation any voids or seams. In another embodiment, the void free gap filling silicon oxide layer formed in process 612 has sufficient good quality characterized by film density, mechanical stress, dielectric constant, and refractive index acceptable for narrow trench STI applications.

Figure 7:
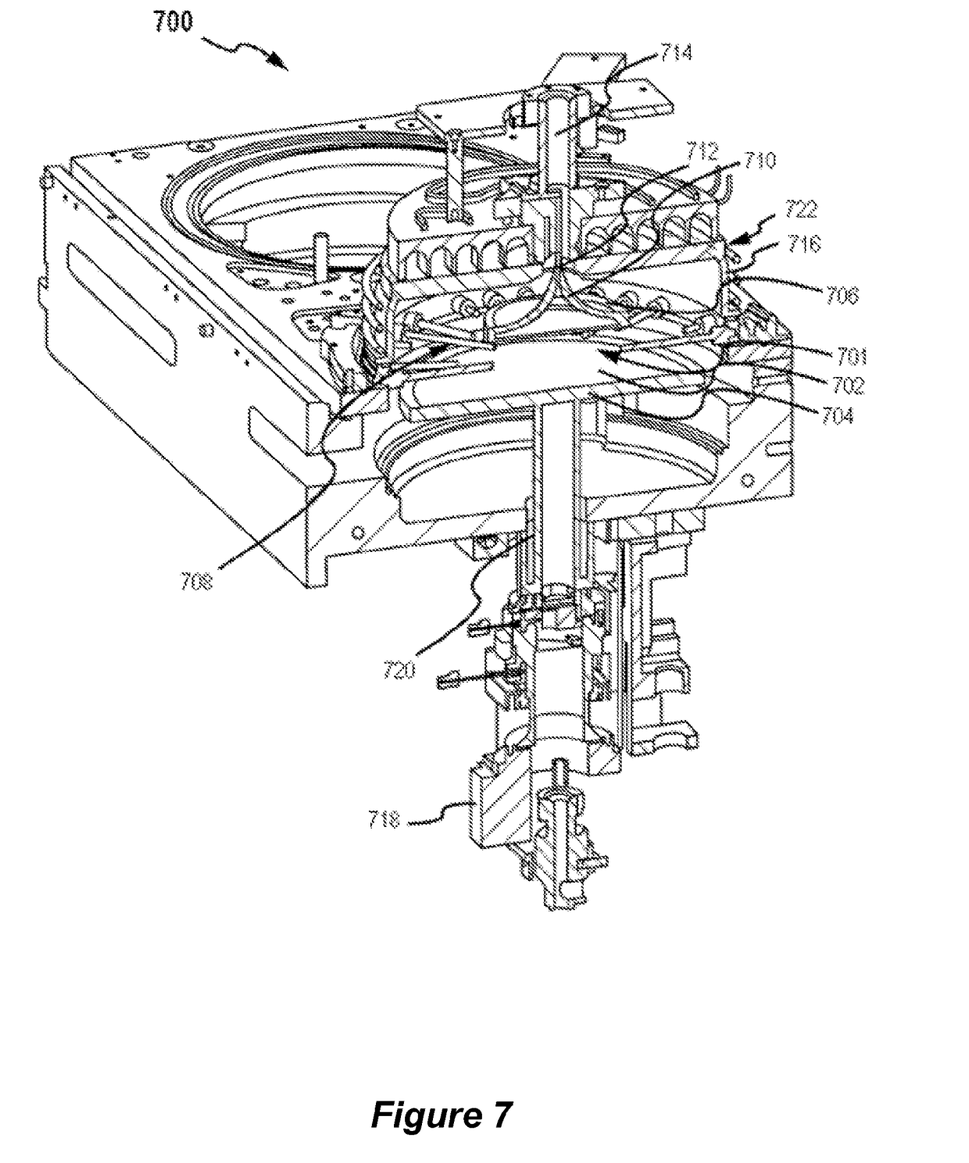
FIG. 7 is a cross sectional view of an exemplary processing system according to an embodiment of the present invention.

FIG. 7 is a cross sectional view of an exemplary processing system according to embodiments of the invention. The system 700 includes a deposition chamber 701 where precursors chemically react and deposit a flowable dielectric film on a substrate wafer 702. The wafer 702 (e.g., 200 mm, 300 mm, 400 mm, etc. diameter semiconductor substrate wafer which may include trenches with high aspect ratios of 5:1 or more, 6:1 or more, 7:1 or more, 8:1 or more, 9:1 or more, 10:1 or more, 11:1 or more, 12:1 or more, etc.) may be coupled to a rotatable substrate pedestal 704 that is also vertically translatable to position the substrate wafer 702 closer or farther away from the overlying precursor distribution system 706. For example, the substrate wafer 702 is the substrate 100 or substrate 300 or substrate 500 described earlier. The pedestal may rotate the substrate wafer 702 at a rotational speed of about 1 rpm to about 2000 rpm (e.g., about 10 rpm to about 120 rpm). The pedestal may vertically translate the substrate wafer at a distance from, for example, about 0.5 mm to about 100 mm from a side nozzle 708 of the precursor distribution system 706.

The precursor distribution system 706 includes a plurality of radially distributed side nozzles 708, each having one of two different lengths. In additional embodiments (not shown) the side nozzles may be eliminated to leave a ring of openings distributed around the wall of the deposition chamber 701. The precursors flow through these openings into the chamber.

The distribution system 706 may also include a conically-shaped top baffle 710 that may be coaxial with the center of the substrate pedestal 704. A fluid channel 712 may run through the center of baffle 710 to supply a precursor or carrier gas with a different composition than the precursor flowing down the outside directing surface of the baffle 710.

The outside surface of the baffle 710 may be surrounded by a conduit 714 that directs a reactive precursor from a reactive species generating system (not shown) that is positioned over the deposition chamber 701. The conduit 714 may be a straight circular tube with one end opening on the outside surface of baffle 710 and the opposite end coupled to the reactive species generating system.

The reactive species generating system may be a remote plasma generating system (RPS) that generates the reactive species by exposing a more stable starting material to the plasma. For example, the starting material may be a mixture that includes molecular oxygen or ozone. The exposure of this starting material to a plasma from the RPS causes a portion of the molecular oxygen to dissociate into atomic oxygen, a highly reactive radical species that will chemically react with an organo-silicon precursor (e.g., TMOS, OMCTS) at much lower temperature (e.g., less than 100° C.) to form a flowable dielectric film on the substrate surface. For example, the flowable dielectric film can be a fluid-like silicon oxide including some residual water and carbon species as well as significant hydroxyl groups. In a specific example, the flowable dielectric film is silicon oxide later 110 shown in FIG. 1. In another specific example, the flowable dielectric film is the silicon oxide later 320 over the conforming amorphous silicon layer shown in FIG. 3. Because the reactive species generated in the reactive species generating system are often highly reactive with other deposition precursors at even room temperature, they may be transported in an isolated gas mixture down conduit 714 and dispersed into the reaction chamber 701 by baffle 710 before being mixed with other deposition precursors. For example, the silicon containing precursors can be dispersed through these baffles during the deposition of the silicon layer overlying the as-deposited flowable silicon oxide layer.

Processing system 700 may also include rf coils (not shown) coiled around the dome 716 of the deposition chamber 701. These coils can create an inductively-coupled plasma in the deposition chamber 701 to further enhance the reactivity of the reactive species precursor and other precursors to deposit the fluid dielectric film on the substrate. For example, a gas flow containing reactive atomic oxygen dispersed into the chamber by baffle 710 and an organo-silicon precursor from channel 712 and/or one or more of the side nozzles 708 may be directed into a plasma formed above the substrate 702 by the rf coils. The atomic oxygen and organo-silicon precursor rapidly react in the plasma even at low temperature to form the highly flowable silicon oxide layer on the substrate surface.

In certain embodiments, the formation of the flowable silicon oxide layer can be after a formation of a thin layer of amorphous silicon layer on the substrate. In other embodiments, the deposition of the flowable silicon oxide layer and the amorphous silicon layer can be performed alternatively for several layers on the substrate. In some embodiments, a plasma enhanced CVD process can be performed for generating silicon nanoparticles that are mixed into the flowable silicon oxide layer formed either alternatively or simultaneously in the same process system 700.

In one embodiment, the process system 700 can make the deposition chamber 701 also being used for subsequent annealing processes. During the annealing process, an oxidative environment can be generated by introducing molecular oxygen gas, or ozone, or atomic oxygen, or steam air with controlled humidity or certain mixture of acidic gas into the chamber. In other embodiment, the oxidative annealing processes may be performed in a separated chamber (not shown) that is coupled with the deposition chamber 701.

Having described several embodiments, it will be recognized by those of skill in the art that various modifications, alternative constructions, and equivalents may be used without departing from the spirit of the invention. Additionally, a number of well known processes and elements have not been described in order to avoid unnecessarily obscuring the present invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the precursor" includes reference to one or more precursors and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

What is claimed is:

1. A method of forming a silicon oxide layer on a substrate, the method comprising:
   providing a substrate;
   forming a first silicon oxide layer overlying at least a portion of the substrate, the first silicon oxide layer including residual water, hydroxyl groups, and carbon species;
   exposing the first silicon oxide layer to a plurality of silicon-containing species at a pressure from about 10 mTorr to about 600 Torr, a temperature from about room temperature to about 900° C., for a time period ranging from about 1 second to about 3 hours, wherein at least a portion of the plurality of silicon-containing species is either reacting with at least a portion of the residual water and hydroxyl groups or being thermally decomposed to form a plurality of amorphous silicon components, the plurality of amorphous silicon components being partially intermixed with the first silicon oxide layer;
   annealing the first silicon oxide layer partially intermixed with the plurality of amorphous silicon components in an oxidative environment to form a second silicon oxide layer on the substrate, wherein at least a portion of amorphous silicon components are oxidized to become part of the second silicon oxide layer, and wherein unreacted residual hydroxyl groups and carbon species in the second silicon oxide layer are substantially removed.

2. The method of claim 1, wherein the first silicon oxide layer is deposited using chemical vapor deposition of a silicon-containing precursor and an oxygen-containing precursor comprising atomic oxygen generated by remote plasma source.

3. The method of claim 1, wherein at least part of the silicon oxide layer is formed in a shallow trench isolation structure.

4. The method of claim 1, wherein the silicon-containing species comprises linear polysilanes (silane, disilane, and higher homologues), cyclic polysilanes (cyclopentasilane), dichlorosilane, or tetrachlorosilane.

5. The method of claim 1, wherein the plurality of silicon-containing species may be diluted with an inert gas.

6. The method of claim 1, wherein the oxidative environment comprises steam at about room temperature to about 900° C., ozone at about room temperature to about 600° C., molecular oxygen at about room temperature to about 900° C., or atomic oxygen from a remote plasma source at about room temperature to about 600° C.

7. The method of claim 1, wherein the annealing is performed in a rapid thermal process (RTP) chamber.

* * * * *

UNITED STATES PATENT AND TRADEMARK OFFICE
CERTIFICATE OF CORRECTION

PATENT NO.        : 7,541,297 B2
APPLICATION NO. : 11/876541
DATED             : June 2, 2009
INVENTOR(S)      : Abhijit Basu Mallick et al.

It is certified that error appears in the above-identified patent and that said Letters Patent is hereby corrected as shown below:

Cover Page, item (75) Inventors, delete "Dimitry" and insert -- Dmitry --

Signed and Sealed this

Third Day of November, 2009

David J. Kappos
*Director of the United States Patent and Trademark Office*